(12) United States Patent
Fu

(10) Patent No.: US 6,436,798 B2
(45) Date of Patent: Aug. 20, 2002

(54) MOSFET DEVICE

(75) Inventor: Kuan-Yu Fu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/382,146

(22) Filed: Aug. 24, 1999

Related U.S. Application Data

(62) Division of application No. 09/059,548, filed on Apr. 13, 1998, now Pat. No. 6,033,959.

(30) Foreign Application Priority Data

Jan. 9, 1998 (TW) .......................................... 87100226

(51) Int. Cl.$^7$ ...................... H01L 21/425; H01L 21/336
(52) U.S. Cl. ........................ 438/524; 438/270; 438/306
(58) Field of Search ............................... 257/330, 329, 257/331, 332, 341; 438/259, 270, 589, 306, 524, 289, 579, 303, 305, 294, 279, 221, 232

(56) References Cited

U.S. PATENT DOCUMENTS

| | | | | |
|---|---|---|---|---|
| 4,835,584 A | * | 5/1989 | Lancaster | 257/330 |
| 5,142,640 A | * | 8/1992 | Iwamatsu | 257/332 |
| 5,329,142 A | * | 7/1994 | Kitagawa et al. | 257/139 |
| 5,763,310 A | * | 6/1998 | Gardner | 438/270 |
| 5,864,158 A | * | 1/1999 | Liu et al. | 257/330 |

* cited by examiner

Primary Examiner—Steven Loke
Assistant Examiner—Shouxiang Hu

(57) ABSTRACT

A method of fabricating a MOSFET device with a multiple T-shaped gate has the following steps. A substrate with an active region and a non-active region is provided, wherein the active region has a plurality of trenches, and the non-active region has a plurality shallow trench isolation structures. A thin insulating layer and a conducting layer are formed in the trenches. The conducting layer is defined to form a gate. The device is implanted with first ions. Then, the device is further implanted with second ions by using a mask, wherein the mask expose the trenches of the active region, and the opening of the mask is wider than the trench. The MOSFET device has at least the following structures. There is a substrate with an active region and a non-active region, wherein the active region has a plurality of trenches and the non-active region has a plurality of shallow trench isolation structures. There is a multiple T-shaped gate with a first part and a second part, wherein the first part is formed between two trenches on the substrate and the second part is formed in the trenches of the active region. There is a source/drain region with a shallow doped region and a deep doped region. The multiple T-shaped gate increases the channel width of the MOSFET device and decreases the short channel effect of the high integrity ICs.

18 Claims, 8 Drawing Sheets

MOSFET DEVICE

This application is a division of U.S. patent application Ser. No. 09/059,548, filed Apr. 13, 1998 now U.S. Pat. No. 6,033,959.

BACKGROUND OF THE INVENTION

1. Field of the Invention

The invention relates in general to a multiple T-shaped gate MOSFET device, and more particularly to a MOSFET device, which can increase the ICs' density and speed without physically scaling down the device's channel length and width.

2. Description of the Related Art

In the process of fabricating a MOSFET device, in order to scale down the device, both the channel width and length dimensions are shortened. As the attempt to increase the ULSI device density and speed continues, the technology in the deep sub-micron regime becomes more and more difficult so that it eventually may reach a theoretical limitation. As a result, it is impossible to limitlessly increase the device's density and speed. In addition, the short channel effect will render the technology even more prohibitive. For example, as the channel width and the length dimensions are shortened, punch through of the carriers and the hot carrier effect occur. When the device is even more scaled down, the short channel effect becomes especially significant.

FIGS. 1A to 1H are schematic, cross-sectional views of conventional MOSFET device formation processes. Referring to FIG. 1A, a device includes a substrate 100, a pad oxide layer 102, a silicon nitride layer 104, and a photoresist layer 106. A mask 108 is used to pattern the device. Referring to FIG. 1B, a trench 107 is formed in the substrate 100 by defining the photoresist layer 106, the silicon nitride layer 104, the pad oxide layer 102 and the substrate 100.

The remainder of the photoresist layer 106a and the silicon nitride layer 104a are removed to expose the remainder of the pad oxide layer 102a, as shown in FIG. 1C. Referring to FIG. 1D, a dielectric layer 110 is formed in the trench 107 and over the substrate 100. The dielectric layer 110 is polished to expose the substrate 100 and form a shallow trench isolation (STI) structure 110a as shown in FIG. 1E. Then, a gate oxide layer 112, a metal layer 114, and a photoresist layer 116 are formed on the substrate in turn. Next, a mask 118 is further used to pattern the device.

A gate 114a is formed on the substrate 100 by defining the photoresist layer 116, the metal layer 114, and the gate oxide layer 112 as shown in FIG. 1F. Then, the substrate 100 is implanted with ions to form a shallow doped region 111 in the substrate 100. Referring to FIG. 1G, an oxide layer 120 is deposited on the substrate 100. Then, the oxide layer 120 is etched to form spacers 120a besides the gate 114a by dry etching as shown in FIG. 1H. Then, the substrate 100 is implanted with ions to form a deep doped region 113.

The technology will reach a limit in developing high integrity and operating rate. When the device becomes smaller the short channel effect becomes especially apparent.

The references regarding changing the gate shape to increase the integrity and the operating rate are:

1. F. E. Holmes and C. A. T Salama, Solid State Electron, 17.791 (1974) for V-shape MOS.
2. C. A. T Salama, Solid State Electron, 20.1003 (1977) for U-shape MOS.

SUMMARY OF THE INVENTION

It is therefore an object of the invention to provide an improved resolution to the conventional MOSFET device. Using a multiple T-shaped gate (utilizing the trench technology), device density and speed can be increased without physically scaling down the MOSFET's channel length and width. Once this approach is adopted in the effort to miniature ULSI devices, the short channel effect will be of much less concern.

It is another object of the invention to provide a MOSFET with multiple T-shaped gate, wherein the gate length is increased to improve the operating rate and the integrity.

The invention achieves the above-identified objects by providing a new method of fabricating a MOSFET with a multiple T-shaped gate. The fabricating method includes the following steps. A substrate with an active region and a non-active region is provided. A plurality of trenches are formed in both the active region and the non-active regions in the substrate. An insulating layer is formed in the trenches. The insulating layer in the trenches of the active region is etched. A thin insulating layer is formed in the trenches of the active region and over the surface of the substrate. A conducting layer is formed in the trenches of the active region. The conducting layer is defined to form a gate. The device is implanted with first ions. Then, the device is further implanted with second ions by using a mask, wherein the mask expose the trenches of the active region, and the opening of the mask is wider than the trench.

The MOSFET device includes at least the following structures. A substrate includes an active region and a non-active region, wherein the active region includes a plurality of trenches and the non-active region includes a plurality of shallow trench isolation structures. A thin insulating layer is formed in the trenches of the active region and over the substrate. A multiple T-shaped gate is formed with a first part and a second part, wherein the first part is formed between two trenches on the substrate, and the second part is formed in the trenches of the active region. A source/drain region includes a shallow doped region and a deep doped region, wherein the shallow doped region is in the substrate under the first part, and the deep doped region is in the substrate beside the second part.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

In accordance with the preferred embodiment of the present invention, a multiple T-shaped gate MOSFET device is provided to increase the operating rate of the ICs and to lower the short channel effect in high integrity ICs. FIGS. 2A to 2G are cross-sectional views showing the process steps of one preferred embodiment for fabricating a two T-shaped gate MOSFET device.

Figure 1A:
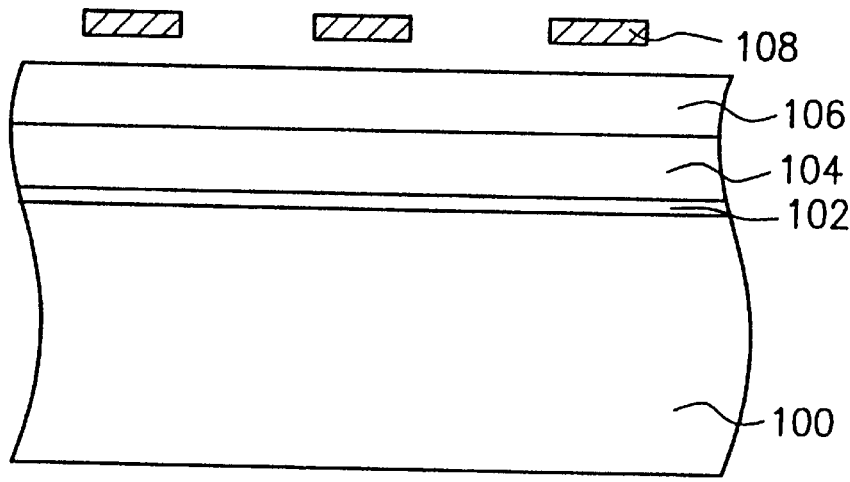
FIGS. 1A to 1H (Prior Art) are cross-sectional views showing a conventional process of forming a gate.
Figure 1B:
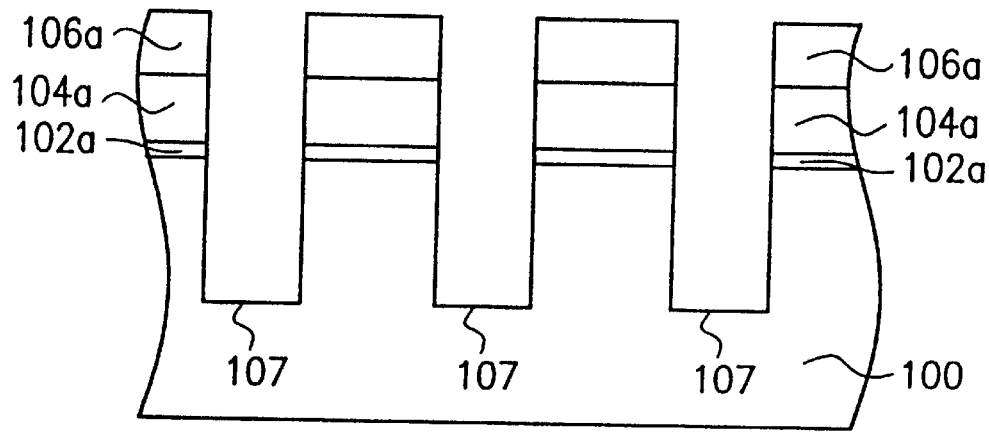
Figure 1C:
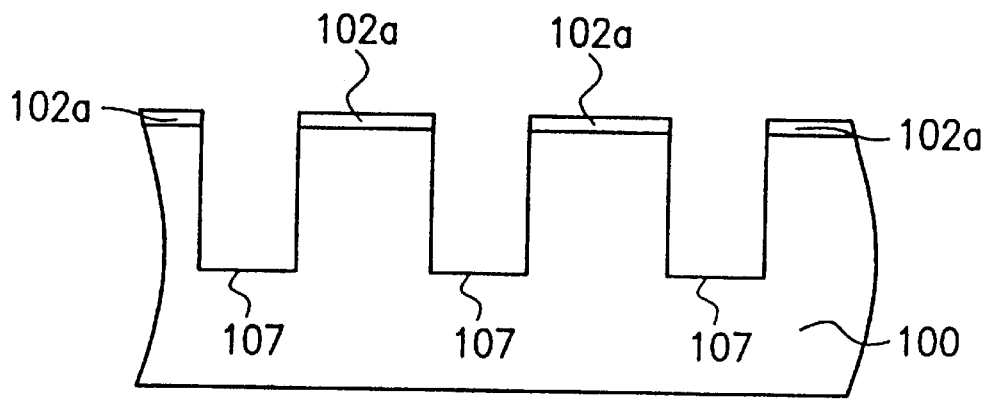
Figure 1D:
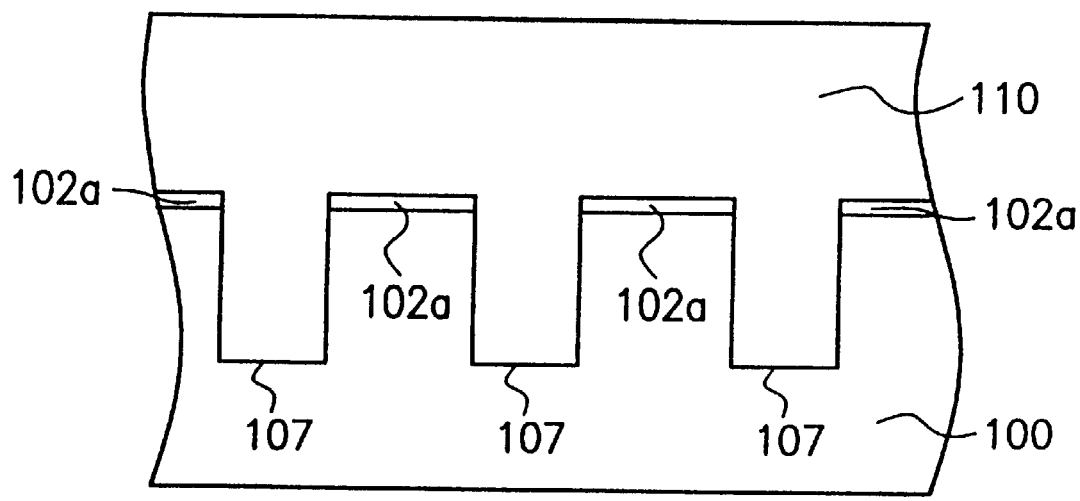
Figure 1E:
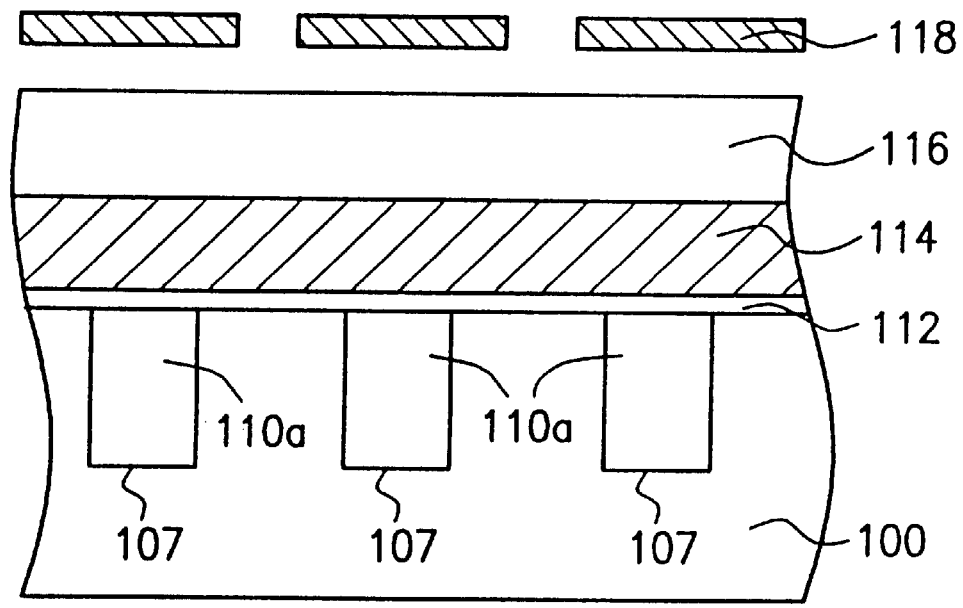
Figure 1F:
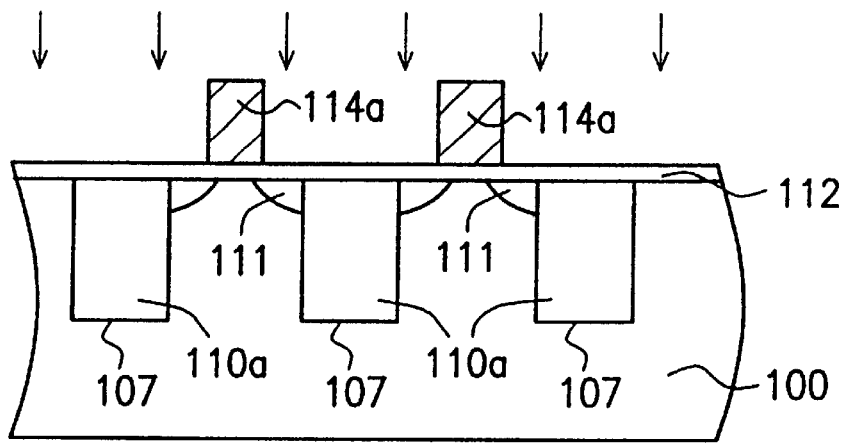
Figure 1G:
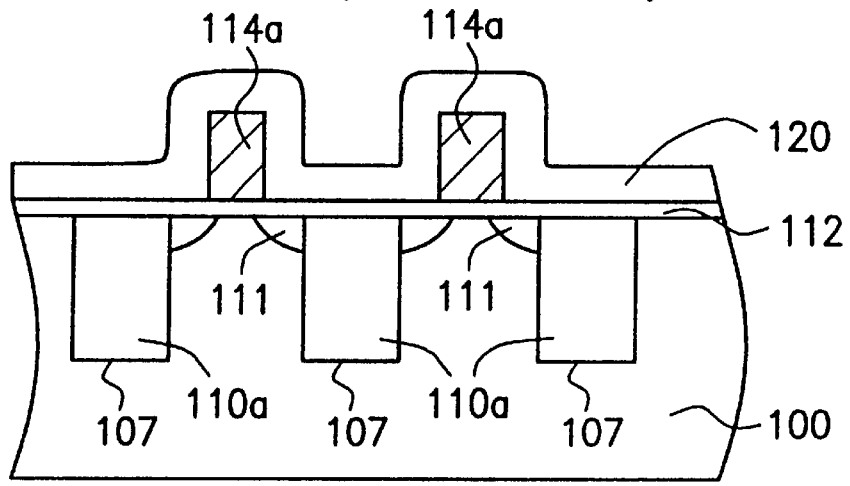
Figure 1H:
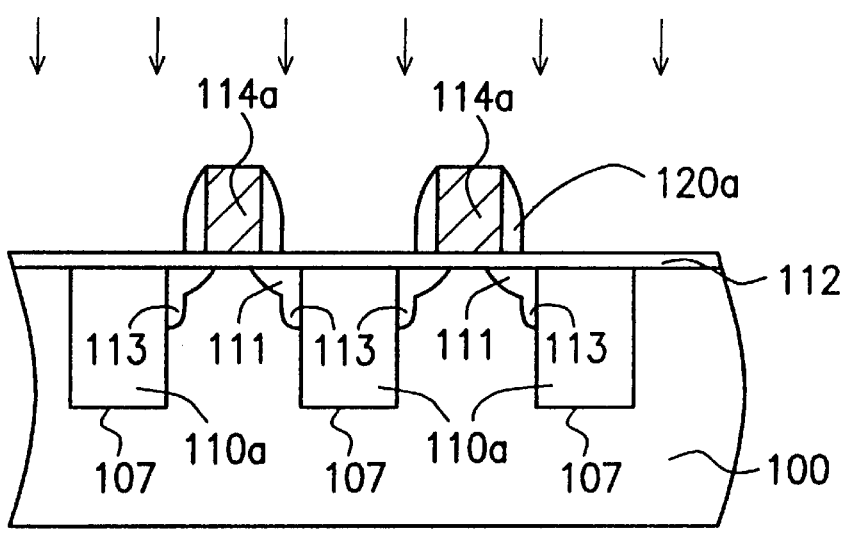
Figure 2A:
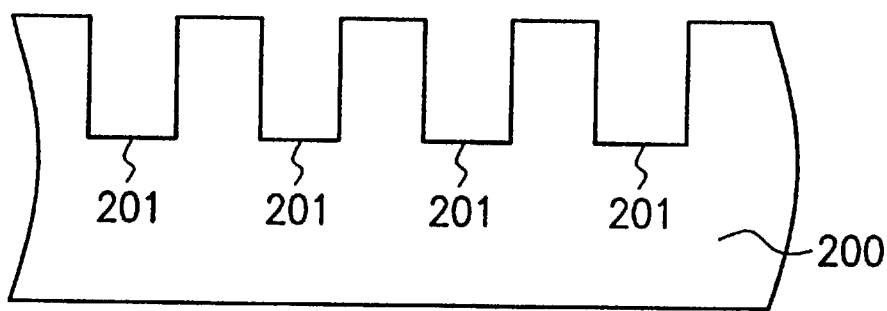
FIGS. 2A to 2G are cross-sectional views showing the process steps of the method for fabricating a multiple T-shaped gate MOSFET device in accordance with a preferred embodiment of the present invention.
Figure 2B:
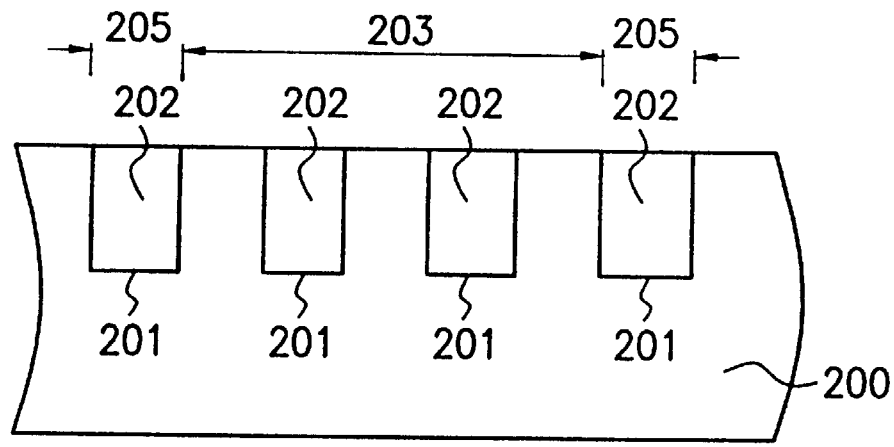

Referring first to FIG. 2A, a substrate 200 is provided, wherein a number of trenches 201 are formed in the substrate 200. A dielectric layer is formed in the trenches 201 and over the substrate 200 by chemical vapor deposition (CVD). Then, the dielectric layer is polished to expose the surface of the substrate 200 and form several shallow trench isolation (STI) structures 202 as shown in FIG. 2B. The device includes an active region 203 and a non-active region 205.

Figure 2C:
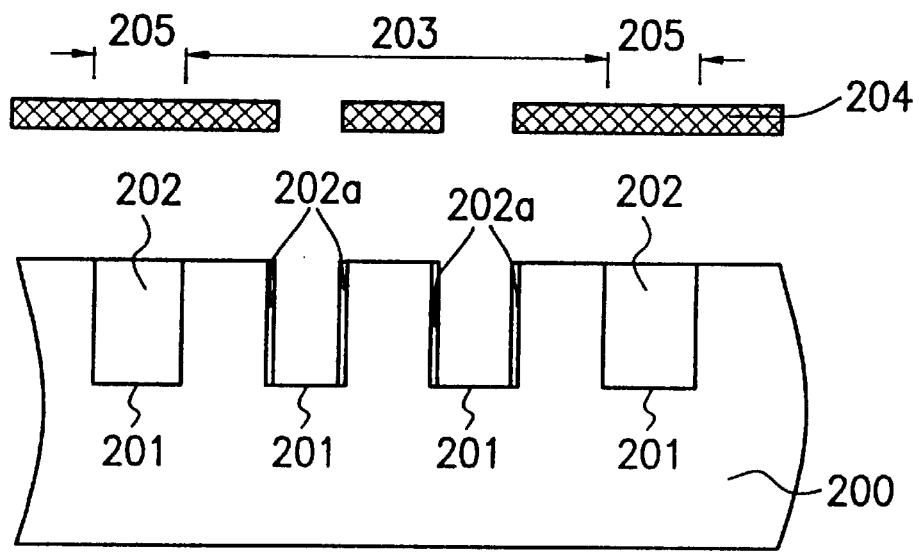

Referring to FIG. 2C, a mask 204 is used to pattern the STI structures 202 of the active region 203. The STI structures 202 of the active region 203 are etched to expose the trenches 201 and leave the remainder of the dielectric layer 202a on the sides of the trenches 201. The STI structures 202 are used to isolate the MOSFET device.

Figure 2D:
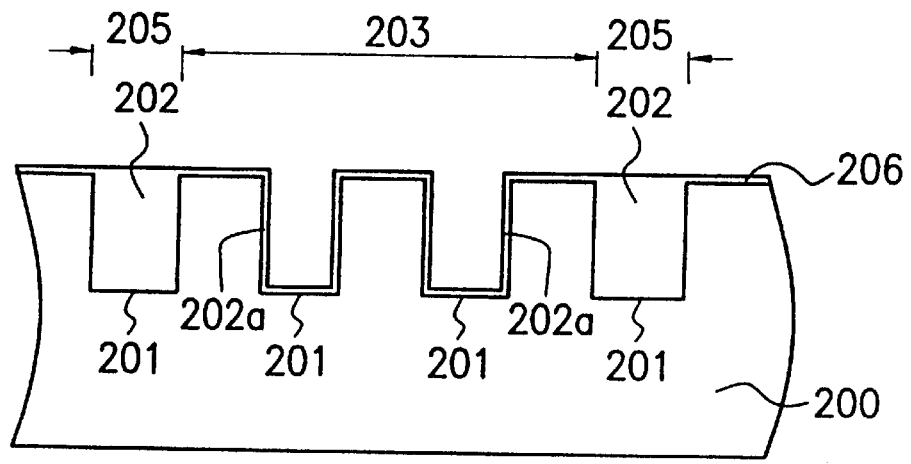
Figure 2E:
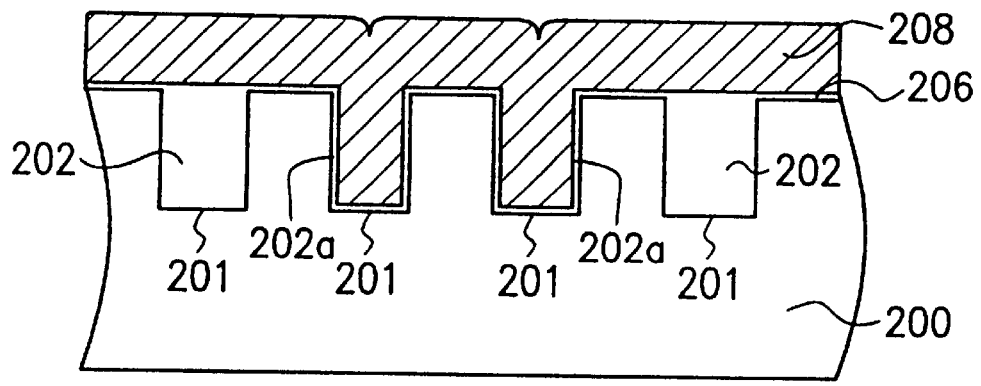

Referring to FIG. 2D, a thin dielectric layer is formed in the trenches 201 and over the substrate 200. The thin dielectric layer formed in the trenches 201 is a side-wall oxide layer 202a and over the substrate 200 is a gate oxide layer 206. The thickness of side-wall oxide layer 202a is about 0.1 $\mu$m. The side-wall oxide layer 202a is used to protect the device from generating parasitic capacitance. Then, a conducting layer 208 is formed on the device by CVD as shown in FIG. 2E.

Figure 2F:
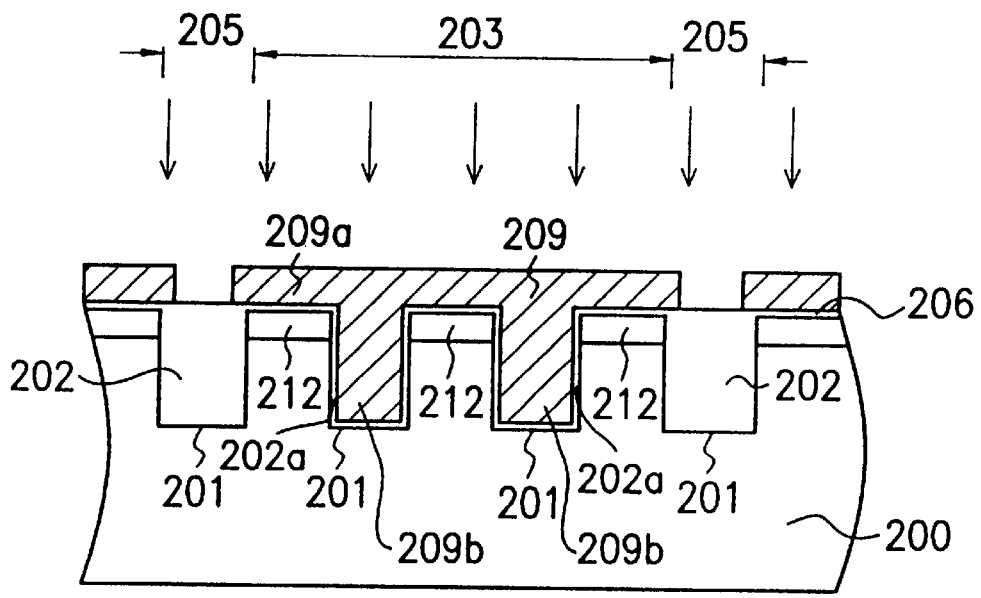

Referring to FIG. 2F, the conducting layer 208 is patterned to form a gate 209. The gate 209 includes a first gate part 209a and a second gate part 209b, wherein the first gate part 209a lies on the substrate 200 between the trenches 201 and the second gate part 209b is in the trenches 201 of the active region 203. Then, the device is implanted to form a number of shallow doped regions 212 in the substrate 200 of the active region 203.

Figure 2G:
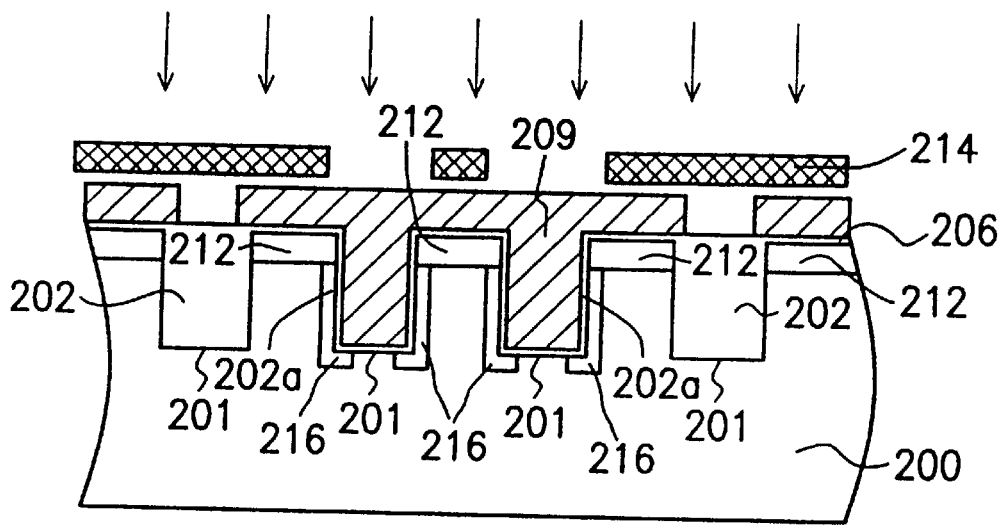

Referring to FIG. 2G, the device is further implanted to form a number of deep doped regions 216 by using a mask 214, wherein the mask 214 is used to expose the trenches 201 of the active region 203. The opening of the mask 214 is wider than the trench 201.

Figure 3A:
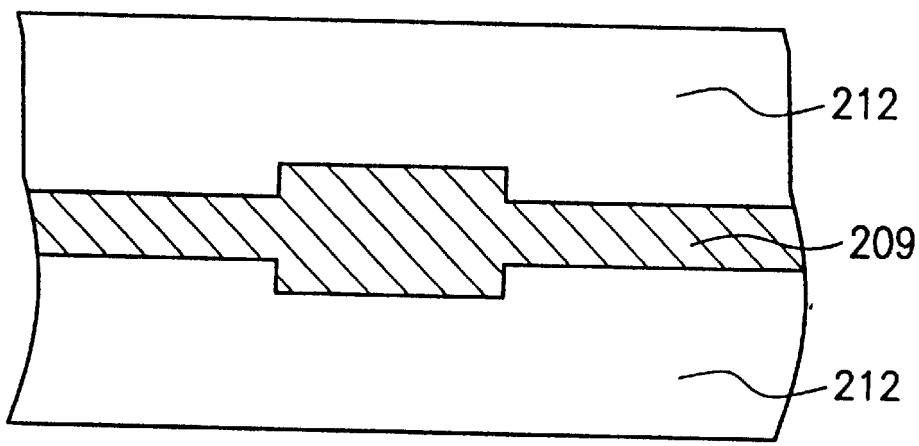
FIGS. 3A to 3B are the top views of the MOSFET device as shown in FIG. 2F and 2G.
Figure 3B:
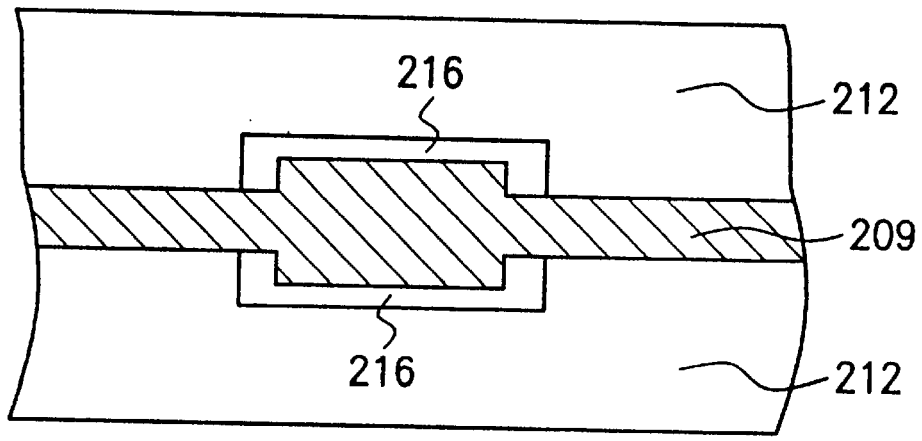

FIG. 3A is the top view of the MOSFET device as shown in FIG. 2F and FIG. 3B is the top view of the MOSFET device as shown in FIG. 2G. FIG. 3A includes the shallow doped region 212 and the gate 209. FIG. 3B includes the deep doped region 216, the shallow doped region 212 and the gate 209.

Figure 4A:
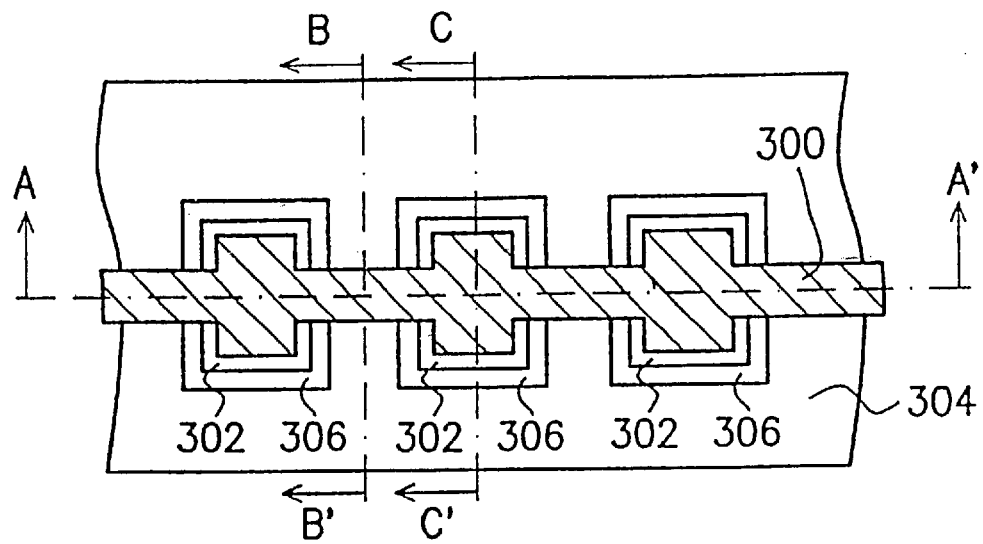
FIGS. 4A to 4D are cross-sectional views of a multiple T-shaped gate MOSFET device in accordance with the preferred embodiment.

FIGS. 4A to 4D show a three T-shaped gate MOSFET device in accordance with the preferred embodiment. FIG. 4A shows a top view of the three T-shaped gate MOSFET device. In FIG. 4A, the device includes a gate 300, a shallow doped region 304, a deep doped region 306, and an oxide layer 302.

Figure 4B:
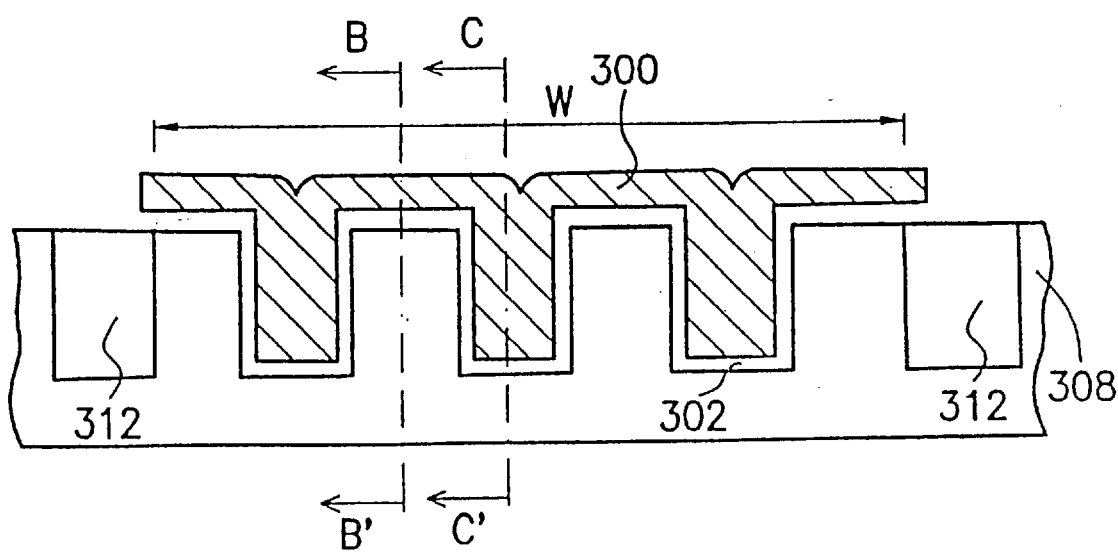

FIG. 4B shows the cross-sectional view taken along the line AA' of the FIG. 4A. As FIG. 4B shows, the device includes a substrate 308, the gate 300, the oxide layer 302 and STI structures 312. W denotes the channel width of the device.

Figure 4C:
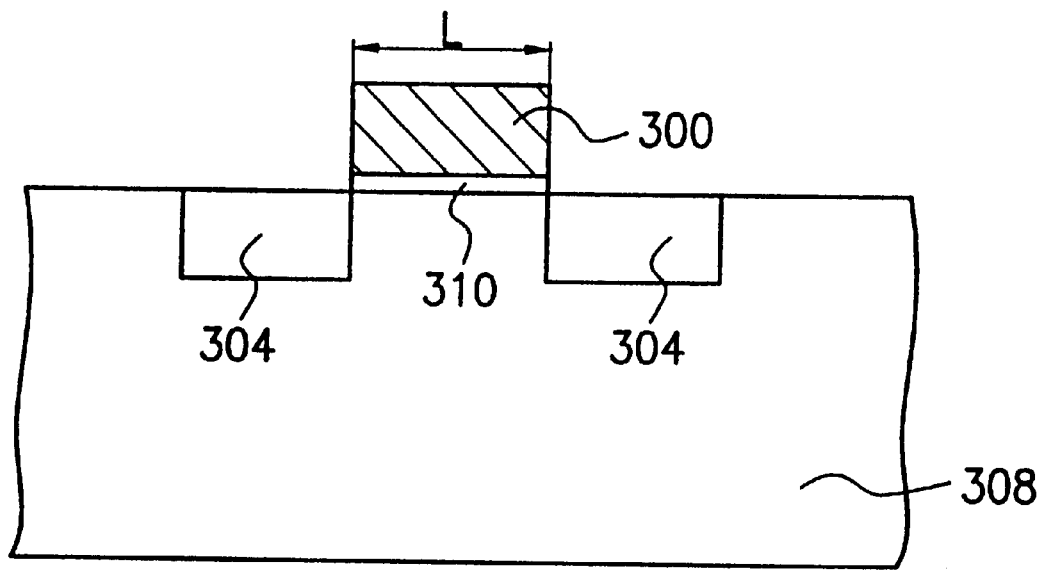

FIG. 4C shows the cross-sectional view taken along the line BB' of the FIGS. 4A and 4B. As FIG. 4C shows, the device includes the substrate 308, the gate 300, the shallow doped region 304, and a gate oxide layer 310 under the gate 300, wherein L denotes the channel length of the device.

Figure 4D:
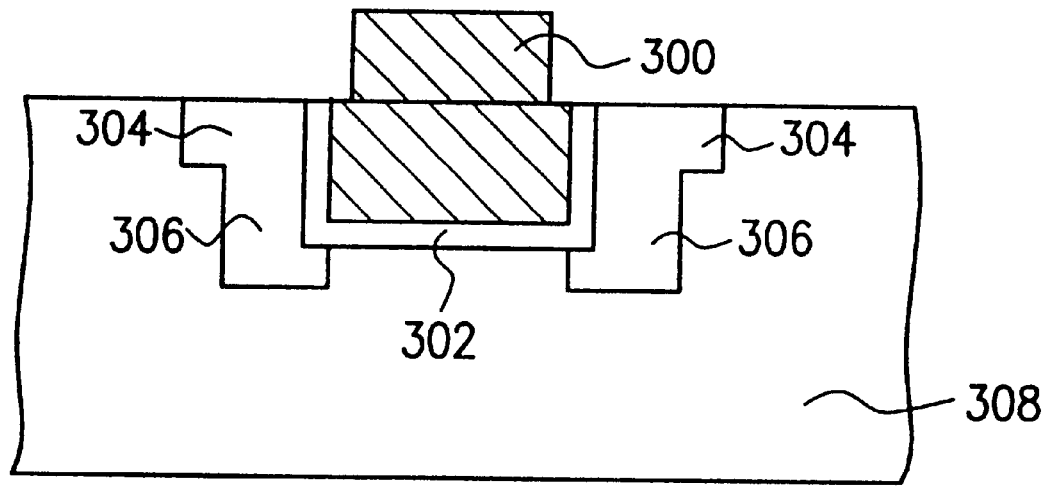

FIG. 4D shows the cross-sectional view taken along the line CC' of the FIGS. 4A and 4B. As FIG. 4D shows, the device includes the substrate 308, the gate 300, the shallow doped region 304, and the deep doped region 306. For the device, the shallow doped region 304 and the deep doped region 306 form the source/drain regions.

The preferred embodiment discloses a multiple T-shaped gate MOSFET device. The device has "gate legs" dipped into the trenches in the substrate. Between the "gate legs" in the trenches and the source/drain junctions, a thicker dielectric layer (>0.11 $\mu$m) is formed to reduce parasitic capacitance. Around the dielectric layer (~0.1 $\mu$m in the horizontal dimension), the source/drain junctions are doped to a depth as deep as the trench to create the transistor action under the bottom as well as at the side walls of the trench. With this special structure, the transistor's width is effectively increased by 2nt, wherein n is the number of trenches and t is the trench depth. This requires 2 extra masks in the process: one for the dielectric etch in the trenches (mask 204 in FIG. 2C) and another for the deep source/drain junction implant (mask 214 in FIG. 2G). The value of the advantages gained by this invention should exceed the price of the extra mask(s). The effective width of the transistor is increased by 2nt, while the real surface dimension can be reduced. For example, if both the trench width and space are 0.5 $\mu$m and t is 1 $\mu$m, the reduction in the linear dimension of ULSI circuits will be 50%. With this approach, instead of continuing the scaled-down of both W and L in MOSFET, one can increase n and t to achieve the same purpose, i.e., to increase density and speed. The short channel effect will be of much less concern in this approach.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor structure comprising a substrate having an active region of a first conductivity type including a channel region and a non-channel region surrounding the channel region, at least a first trench and a second trench disposed in the channel region, the method comprising:

forming a thin insulating layer over the said first and second trenches in the active region; wherein the thin insulating layer is conformal to the profile of said first and second trenches;

forming a conductive layer to fill the trenches in the active region;

patterning the conductive layer to form a gate electrode, wherein the gate electrode comprises a first vertical portion, a second vertical portion and a horizontal portion, with the first vertical portion being embedded inside the first trench, the second vertical portion being embedded inside the second trench, and the horizontal portion being disposed over the substrate and connecting said first and second vertical portions together;

performing a first ion implantation with first ions to form a first doped region within the substrate at an upper corner adjacent to the first vertical portion of the gate electrode and a second doped region at an upper corner adjacent to the second vertical portion of the gate electrode; and performing a second ion implantation with second ions by using a mask, to form a deep source/drain region within the substrate, wherein the opening in said mask is wider than each of the first and second trenches and the deep source/drain region is formed at a depth deeper than the first and second trenches.

2. The method according to claim 1, wherein the thin insulating layer is formed by thermal oxidation.

3. The method according to claim 1, wherein the thickness of the thin insulating layer is about 0.1 μm.

4. The method according to claim 1, wherein the step of first ion implantation with first ions is to form a shallow doped region.

5. A method of fabricating a MOSFET device comprising a substrate having at least an active region and a non-active region, at least a first trench and a second trench in the active region and at least a trench in the non-active region, and a dielectric layer completely filling the trench in the non-active region, the method comprising:

forming a thin insulating layer over the said first and second trenches in the active region; wherein the thin insulating layer is conformal to the profile of said first and second trenches;

forming a conductive layer to fill the trenches in the active region;

patterning the conductive layer to form a gate electrode, wherein the gate electrode comprises a first vertical portion, a second vertical portion and a horizontal portion, with the first vertical portion being imbedded inside the first trench, the second vertical portion being embedded inside the second trench, and the horizontal portion being disposed over the substrate and connecting said first and second vertical portions together;

performing a first ion implantation with first ions to form a first doped region within the substrate at an upper corner adjacent to the first vertical portion of the gate electrode and a second doped region at an upper corner adjacent to the second vertical portion of the gate electrode; and performing a second ion implantation with second ions by using a mask, to form a deep source/drain region within the substrate, wherein the opening in said mask is wider than each of said first and second trenches and the deep source/drain region is formed at a depth deeper than said first and second trenches.

6. The method according to claim 5, wherein the thin insulating layer is formed by thermal oxidation.

7. The method according to claim 5, wherein the thickness of the thin insulating layer is about 0.1 μm.

8. The method according to claim 5, wherein the step of first ion implantation with first ions is to form a shallow doped region.

9. A method of fabricating a MOSFET device, comprising the steps of:

providing a substrate of a first conductive type, including an active region and a non-active region;

forming at least a first trench, a second trench in the active region and at least a third trench in the non-active region;

forming a dielectric layer in the said trenches;

removing the dielectric layer in the first and second trenches of the active region;

forming a thin insulating layer in the first and second trenches and over the substrate;

forming a conducting layer over the substrate;

patterning the conductive layer to form a gate electrode, wherein the gate electrode comprises a first vertical portion, a second vertical portion and a horizontal portion, with the first vertical portion being embedded inside the first trench, the second vertical portion being embedded inside the second trench, and the horizontal portion being disposed over the substrate and connecting the first and second portion together;

performing a first ion implantation with first ions to form a first doped region within the substrate at an upper corner adjacent to the first vertical portion of the gate electrode and a second doped region at an upper corner adjacent to the second vertical portion of the gate electrode; and performing a second ion implantation with second ions by using a mask, to form a deep source/drain region within the substrate, wherein the opening in said mask is wider than each of the first and second trenches and the deep source/drain region is formed at a depth deeper than said first and second trenches.

10. The method according to claim 9, wherein the dielectric layer is formed by chemical vapor deposition.

11. The method according to claim 9, wherein the thin insulating layer is formed by thermal oxidation.

12. The method according to claim 9, wherein the thickness of the thing insulating layer is about 0.1 μm.

13. The method according to claim 9, wherein the conducting layer is formed by chemical vapor deposition.

14. The method according to claim 9, wherein the step of first and second ion implantation is performed using ions of a second conductive type.

15. A method of reducing junction capacitance in a MOSFET device, the MOSFET device comprising a substrate of a first conduction type having at least an active region and a non-active region, at least a first group of trenches in the active region and at leas a second trench in the non-active region, and a dielectric layer completely filling the second trench in the non-active region, the method comprising:

forming a thin insulating layer in the first group of trenches and over the substrate;

forming a trench gate electrode, wherein the trench gate electrode comprises vertical portions, and a horizontal portion, the vertical portions being embedded inside the first group of trenches, and the horizontal portion being disposed over the substrate and connecting said vertical portions;

performing a first ion implantation with first ions to form a lightly doped region within the substrate at an upper corner adjacent to the vertical portions of the gate electrode; and performing a second ion implantation with second ions by using a mask, to form a deep source/drain region within the substrate, wherein the opening in said mask is wider than each trench in aid first group of trenches and the deep source/drain region is formed at a depth deeper than said first group of trenches.

16. The method according to claim 15, wherein the thin insulating layer is formed by thermal oxidation.

17. The method according to claim 15, wherein the thickness of the thing insulating layer is about 0.1 μm.

18. The method according to claim 15, wherein the step of first and second ion implantation is performed using ions of second conductive type.

* * * * *